United States Patent
Dai et al.

(10) Patent No.: US 11,239,853 B1
(45) Date of Patent: Feb. 1, 2022

(54) HYBRID ANALOG-TO-DIGITAL CONVERTER WITH MULTI-DOMAIN SIGNAL PROCESSING

(71) Applicant: Digital Analog Integration, Inc., Auburn, AL (US)

(72) Inventors: Fa Dai, Auburn, AL (US); Haoyi Zhao, Auburn, AL (US); John David Irwin, Auburn, AL (US)

(73) Assignee: Digital Analog Integration, Inc., Auburn, AL (US)

( * ) Notice: Subject to any disclaimer, the term of this patent is extended or adjusted under 35 U.S.C. 154(b) by 0 days.

(21) Appl. No.: 17/082,481

(22) Filed: Oct. 28, 2020

(51) Int. Cl.
| | |
|---|---|
| *H03M 1/10* | (2006.01) |
| *G04F 10/00* | (2006.01) |
| *H03M 1/16* | (2006.01) |
| *H03M 1/50* | (2006.01) |
| *H03M 1/14* | (2006.01) |

(52) U.S. Cl.
CPC ........ *H03M 1/1009* (2013.01); *G04F 10/005* (2013.01); *H03M 1/145* (2013.01); *H03M 1/164* (2013.01); *H03M 1/50* (2013.01)

(58) Field of Classification Search
CPC ...... H03M 1/1009; H03M 1/50; H03M 1/069; H03M 1/145; H03M 1/164; G04F 10/005
See application file for complete search history.

(56) References Cited

U.S. PATENT DOCUMENTS

| | | | |
|---|---|---|---|
| 8,138,958 B2* | 3/2012 | Dai .................. | G04F 10/005 341/155 |
| 9,673,835 B1* | 6/2017 | Kinyua ............... | H03M 1/468 |
| 10,007,235 B2* | 6/2018 | Wang .................. | G04F 10/005 |
| 10,061,272 B2* | 8/2018 | Chiu .................. | H03M 1/1245 |
| 10,164,653 B1* | 12/2018 | Kinyua ............... | H03M 1/1042 |
| 10,461,761 B2* | 10/2019 | Kinyua ............... | H03M 1/145 |
| 2008/0069292 A1 | 3/2008 | Straayer et al. | |

OTHER PUBLICATIONS

Su et al., "A 280MS/s 12b SAR-Assisted Hybrid ADC with Time Domain Sub-Range Quantizer in 45nm CMOS", IEEE Custom Integrated Circuits Conference, 2019, 4 pages.
Zhang et al., "A 0.6-V 13-bit 20-MS/s Two-Step TDC-Assisted SAR ADC With PVT Tracking and Speed-Enhanced Techniques", IEEE Journal of Solid-State Circuits, 2019, 14 pages, vol. 54, Issue 12.

\* cited by examiner

*Primary Examiner* — Khai M Nguyen
(74) *Attorney, Agent, or Firm* — Lempia Summerfields Katz LLC

(57) ABSTRACT

An analog-to-digital converter includes a first converter stage, a second converter stage coupled to the first converter stage to quantize a residue signal of the first converter stage, and an inter-stage converter disposed between the first and second converter stages. The inter-stage converter is configured to convert between a first domain and a second domain. The inter-stage converter is configured to process the residue signal of the first converter stage such that a range of the residue signal matches a full scale of the second converter stage.

16 Claims, 10 Drawing Sheets

HYBRID ANALOG-TO-DIGITAL CONVERTER WITH MULTI-DOMAIN SIGNAL PROCESSING

STATEMENT REGARDING FEDERALLY SPONSORED RESEARCH OR DEVELOPMENT

This invention was made with government support under Contract No. W911QX19C0004 awarded by the Army Research Lab. The government has certain rights in the invention.

BACKGROUND OF THE DISCLOSURE

Field of the Disclosure

The disclosure relates generally to analog-to-digital converters (ADCs).

Brief Description of Related Technology

Broadband communications, such as the emerging 5G wireless system, demand high speed and power efficient ADCs. Among the various ADC topologies, flash ADCs feature a high conversion rate. However, they are not suitable for applications with medium-to-high resolution due to the exponentially increased hardware and power consumption. Pipeline ADCs are suitable for medium-to-high resolution designs with moderate conversion speed. However, the pipeline architecture uses highly linear and power-hungry inter-stage amplifiers to amplify the residues of the preceding stages. This requirement prevents pipeline architectures from being adopted in high performance ADC designs.

The successive-approximation-register (SAR) ADC has become one of the most popular architectures in recent years due to its good power efficiency, lower mismatch and improved conversion rate in advanced CMOS technology. There are many techniques, such as the monotonic switching capacitor-digital-to-analog converter (CDAC) and the dynamic comparator arrays, that enhance the SAR ADC conversion speed and hence the overall performance. However, the performance of a single stage SAR ADC is generally limited by the following issues. The conversion speed degrades at high resolution. For instance, it is hard to achieve a several hundred MS/s sample rate with more than 10-bit resolution. The comparator noise, which is lower than half of the ADC resolution step, is mainly constrained by its thermal noise. When resolution increases, the power consumption of the comparator increases exponentially to suppress its noise and achieve the desirable comparison time, which degrades the overall power efficiency.

In order to meet low power and high-speed requirements, pipelined SAR ADC architectures have been adopted to address the problems outlined above. A hybrid architecture has several advantages when compared with conventional SAR ADCs. The pipeline architecture allows each pipeline stage to operate simultaneously, accelerating the overall conversion time. The amplification stages between two pipeline stages provide sufficient gain to relax the noise requirement in subsequent stages. The hybrid architecture inherits the advantages present in different structures. For instance, employing a SAR ADC as the first stage inherits its good power efficiency and employing a flash ADC as the first stage inherits superior conversion speed. In prior designs, a pipelined SAR ADC with a multiplying DAC (MDAC) subrange quantizer suppresses noise by providing large MDAC gain. A pipelined SAR ADC with 2-bit per cycle SAR ADC as the coarse quantizer in the first stage with its resulting zero-crossing based interface achieves not only fast conversion speed, but also process-voltage-temperature (PVT) constant performance with open-loop amplifiers. However, amplification stages are still used in such architectures in order to relax the noise requirements in subsequent stages, which leads to several problems. Advanced CMOS technology in the deep submicron region presents challenges for high gain closed-loop amplifier designs due to reduced power supply voltage. Open-loop amplifiers can be considered but their gains are affected by PVT variations. Regardless of the type of amplifier employed, large power consumption is inevitable in order to provide the desired voltage gain and linearity.

The pipelined SAR ADCs perform data conversion only in the voltage domain, and these devices are facing increasing challenges in deep submicron CMOS technology with reduced supply voltages. For instance, as the power supply voltage is reduced in deep submicron technologies (e.g., 1.8 V in 130 nm technology versus 0.8 V in 22 nm technology), the voltage domain full scale is reduced, resulting in insufficient dynamic range. Therefore, this approach is not suitable for achieving fine quantization in high resolution data converter designs. Also, inter-stage amplifiers used in voltage domain pipeline topologies have stringent gain and linearity requirements. Thus, the design of high-performance voltage amplifiers becomes challenging in advanced technology.

In comparison, if the fine quantizer is implemented in the time domain, the aforementioned challenges can be almost universally avoided. A voltage-to-time convertor (VTC) works as the interface between the voltage quantizer and the time domain quantizer, and this arrangement provides good linearity with low power consumption. For instance, the linearity of the discharging based VTC is related to discharging current sources rather than the transconductance of the transistors, and this result achieves good linearity. The voltage-to-time gain of the discharging based VTC is related to the discharging slope rather than power consumption. Therefore, it consumes less power when providing higher gain. The noise requirement of the time domain comparators is also relaxed, since it is the interval between two edges in the time domain rather than the voltage difference between small voltage residues (50 μV to 200 μV), that must be resolved. Thus, time domain quantizers are more suitable for fine quantization than voltage domain quantizers.

Time quantizers have been utilized in pipelined SAR ADCs. An architecture with pipelined SAR ADCs, a discharging-based VTC, and a time-to-digital-converter (TDC) including discharging-based delay cells has been presented for internal PVT tracking. However, the architecture suffers from a slow conversion speed caused by prolonged propagation delays through the VTC and TDC. Another architecture with a pipelined, 2-bit per cycle SAR ADC and a 2-D Vernier TDC was presented to improve the conversion speed. However, the amplifier-based VTC is adversely affected by PVT variations.

SUMMARY OF THE DISCLOSURE

Analog-to-digital converters including a hybrid pipelined topology with multi-domain signal processing are described. The multi-domain signal processing includes, but is not limited to, voltage, current, time, frequency and charge domain signal processing and quantization.

In accordance with one aspect of the disclosure, an analog-to-digital converter includes a first converter stage, a second converter stage coupled to the first converter stage to quantize a residue signal of the first converter stage, and an inter-stage converter disposed between the first and second converter stages, the inter-stage converter being configured to convert between a first domain and a second domain. The inter-stage converter is configured to process the residue signal of the first converter stage such that a range of the residue signal matches a full scale of the second converter stage.

In accordance with another aspect of the disclosure, an analog-to-digital converter includes a first converter stage configured for voltage domain quantization, a second converter stage configured for time-to-digital quantization, the second converter stage being coupled to the first converter stage to quantize a residual voltage of the voltage domain quantization, and an inter-stage converter disposed between the first and second converter stages, the inter-stage converter being configured to convert from a voltage domain to a time domain. The inter-stage converter is configured to process the residual voltage of the voltage domain quantization such that a range of the residual voltage matches a full scale of the time-to-digital quantization.

In accordance with yet another aspect of the disclosure, an analog-to-digital converter includes a first converter stage configured for voltage domain quantization, a second converter stage including a single-ring, time-to-digital converter (TDC) for time-to-digital quantization, the second converter stage being coupled to the first converter stage to quantize a residual voltage of the voltage domain quantization, and an inter-stage converter disposed between the first and second converter stages, the inter-stage converter being configured to convert the residual voltage from a voltage domain to a time domain. The inter-stage converter is configured to process the residual voltage such that a range of the residual voltage of the voltage domain quantization matches a full scale of the time-to-digital quantization.

In accordance with still another aspect of the disclosure, an analog-to-digital converter includes a first converter stage configured for voltage domain quantization, a second converter stage including a Vernier-ring, time-to-digital converter (TDC), the second converter stage being coupled to the first converter stage to quantize a residual voltage of the voltage domain quantization, and an inter-stage converter disposed between the first and second converter stages, the inter-stage converter being configured to convert the residual voltage from a voltage domain to a time domain.

In connection with any one of the aforementioned aspects, the analog-to-digital converters described herein may alternatively or additionally include or involve any combination of one or more of the following aspects or features. The residue signal of the first converter stage corresponds with a least significant bit (LSB) in the first domain. The first converter stage includes a continuous switching capacitor DAC (CDAC) and a crossing detector. The inter-stage converter includes a voltage-to-time converter (VTC), the VTC having an input coupled to the crossing detector. The second converter stage includes a ring time-to-digital converter (TDC). Switching of the CDAC is timed by the ring TDC so that the range of the residue signal of the first converter stage is equal to the full scale of the TDC. The TDC and the VTC operate simultaneously. The analog-to-digital converter further includes a background calibration loop to align the range of the residue signal of the first converter stage with the full scale of the second converter stage. The inter-stage converter includes a discharging-based voltage-to-time converter (VTC). The first domain is a voltage domain. The second domain is a time domain. The inter-stage converter is configured to convert from the voltage domain to the time domain. The residue signal has a residual voltage range equal to the full scale of the second converter stage. In a system including a set of analog-to-digital converters, each analog-to-digital converter is configured in accordance with the examples described herein. The set of analog-to-digital converters are disposed in a parallel, time-interleaved arrangement. The system further includes a timing skew calibration circuit configured to determine timing skew via a comparison of a difference between sampling edges with an average value of sampling edge differences. The first converter stage includes a continuous switching capacitor DAC (CDAC) and a crossing detector. The inter-stage converter includes a voltage-to-time converter (VTC), the VTC having an input coupled to the crossing detector. The second converter stage includes a ring time-to-digital converter (TDC). Switching of the CDAC is timed by the ring TDC so that the range of the residual voltage of the voltage domain quantization is equal to the full scale of the time-to-digital (TDC) quantization. The TDC and the VTC operate simultaneously. The analog-to-digital converter further includes a background calibration loop to align the range of the residual voltage of the voltage domain quantization with the full scale of the time-to-digital (TDC) quantization. The inter-stage converter includes a discharging-based voltage-to-time converter (VTC).

BRIEF DESCRIPTION OF THE DRAWING FIGURES

For a more complete understanding of the disclosure, reference should be made to the following detailed description and accompanying drawing figures, in which like reference numerals identify like elements in the figures.

Figure 3:
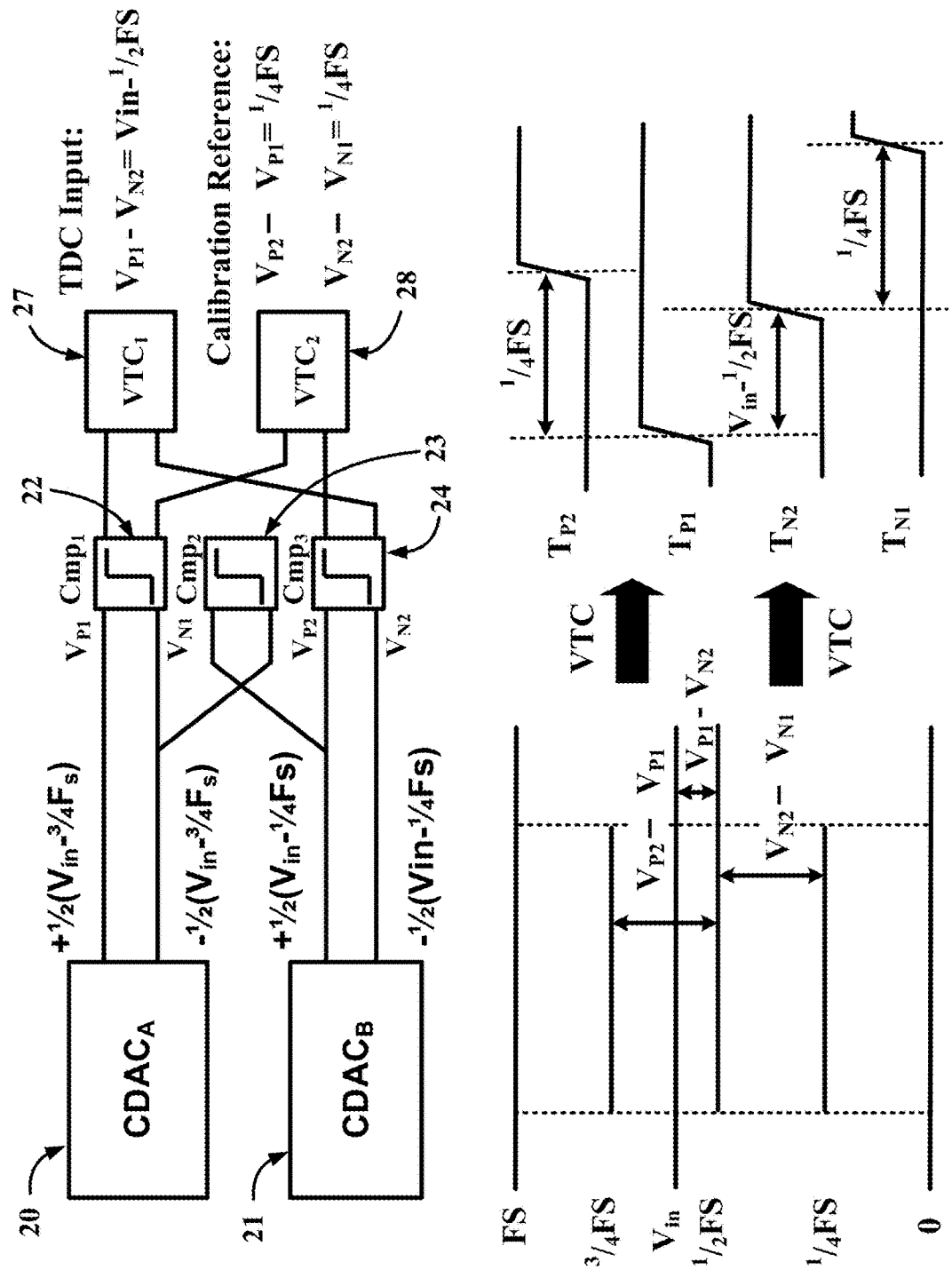

FIG. 3 depicts a schematic, partial view of a SAR ADC stage for use in a hybrid ADC in accordance with one example to show the generation of multiple (e.g., four) voltage residues from the 2-bit per cycle coarse SAR ADC stage and the utilization thereof to produce an input for the TDC fine quantizer stage of the hybrid ADC, as well as to show the information used for PVT calibration. Derived from the two residues, the difference between voltages $V_{P1}$ and $V_{N2}$ contains the residue voltage information so that the residues can be used as the VTC inputs. The differences between the voltages $V_{P1}$ and $V_{P2}$, $V_{N1}$ and $V_{N2}$ contain the full-scale information so that the residues can be used as references for PVT calibration. The full-scale value is checked in every conversion cycle to ensure that full-scale in the time domain is aligned with that of the voltage domain. Therefore, robust performance over PVT variations is guaranteed.

Figure 4:
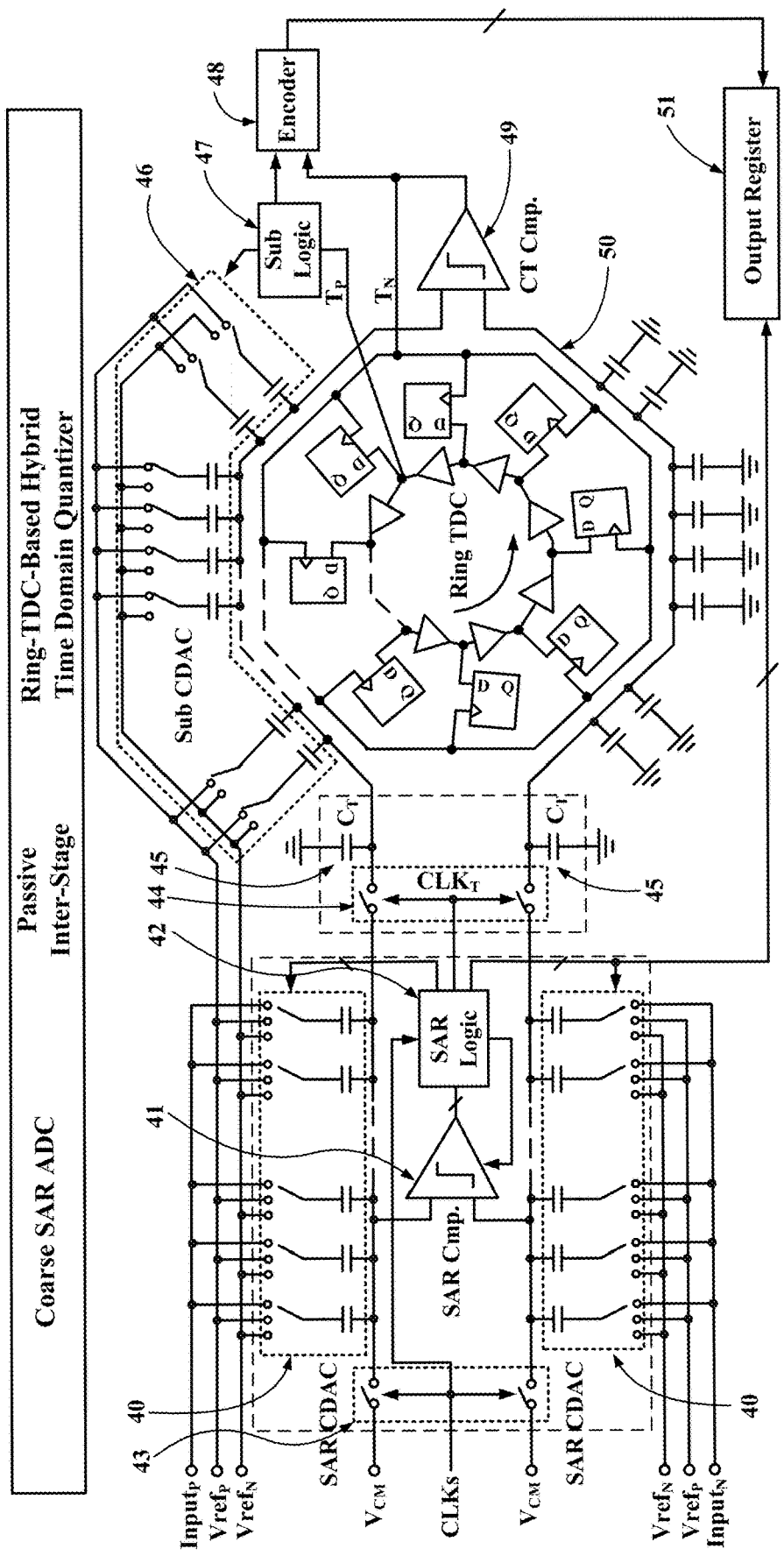

FIG. 4 is a schematic view of a hybrid ADC having a coarse SAR ADC stage, an inter-stage with a passive residue transfer technique, and a hybrid ring TDC-based fine quantizer stage in the time domain in accordance with one example.

Figure 5:
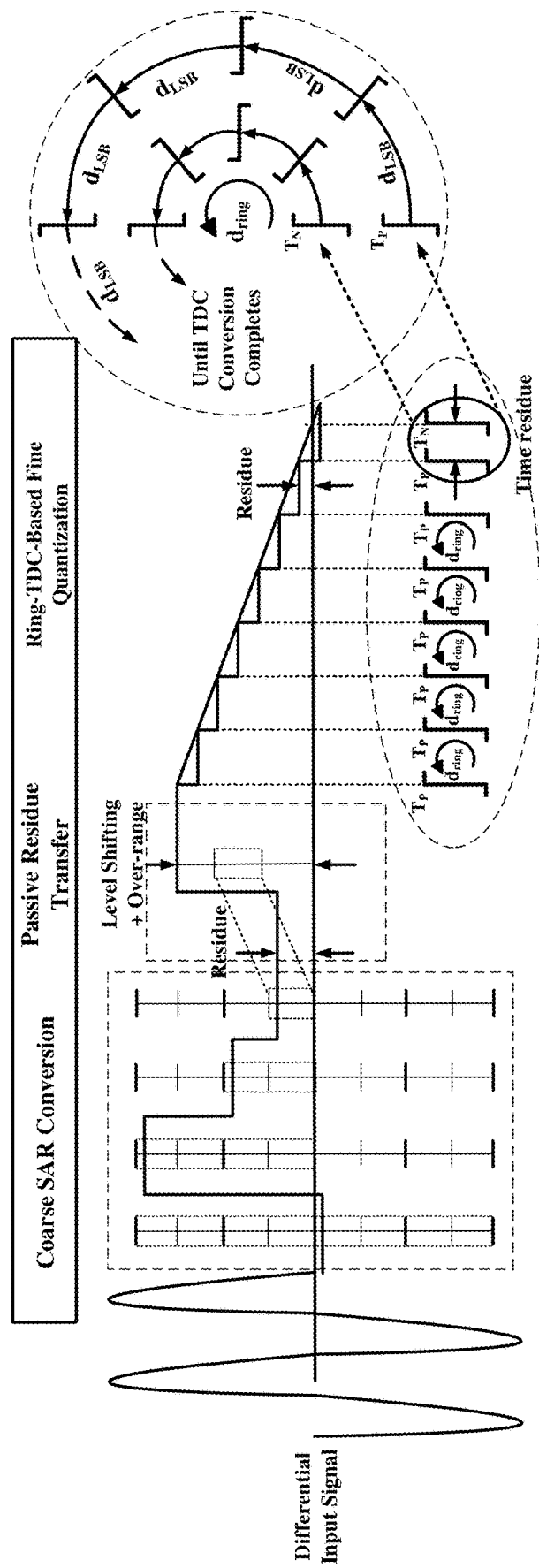

FIG. 5 depicts a graphical and diagrammatic view of the signal propagation and other operation of the hybrid ADC of FIG. 4.

Figure 6:
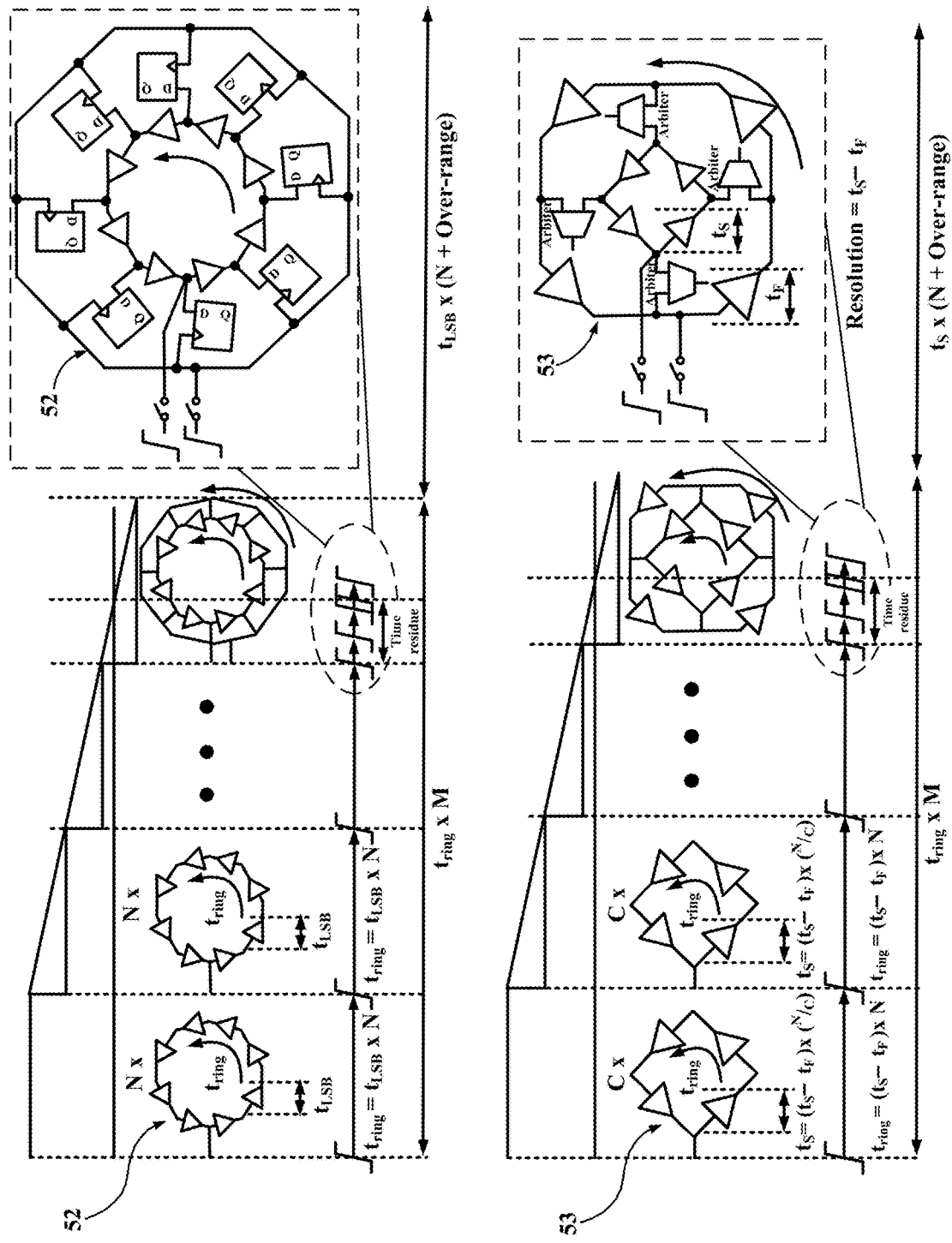

FIG. 6 depicts schematic views of ring-TDC based fine quantizers in accordance with two examples, one based upon a single ring TDC, and the other based on a Vernier ring TDC. Parameters N and C represent the number of delay cells placed in one ring. Parameter M refers to the full scale of the switching-capacitor based VTC, which represents the number of laps the signal propagates in the ring before the second time residue is generated. Both examples can be implemented with internal PVT tracking. The single ring example provides faster conversion speed, while the Vernier example provides finer resolution and a larger time domain detectable range.

Figure 7:
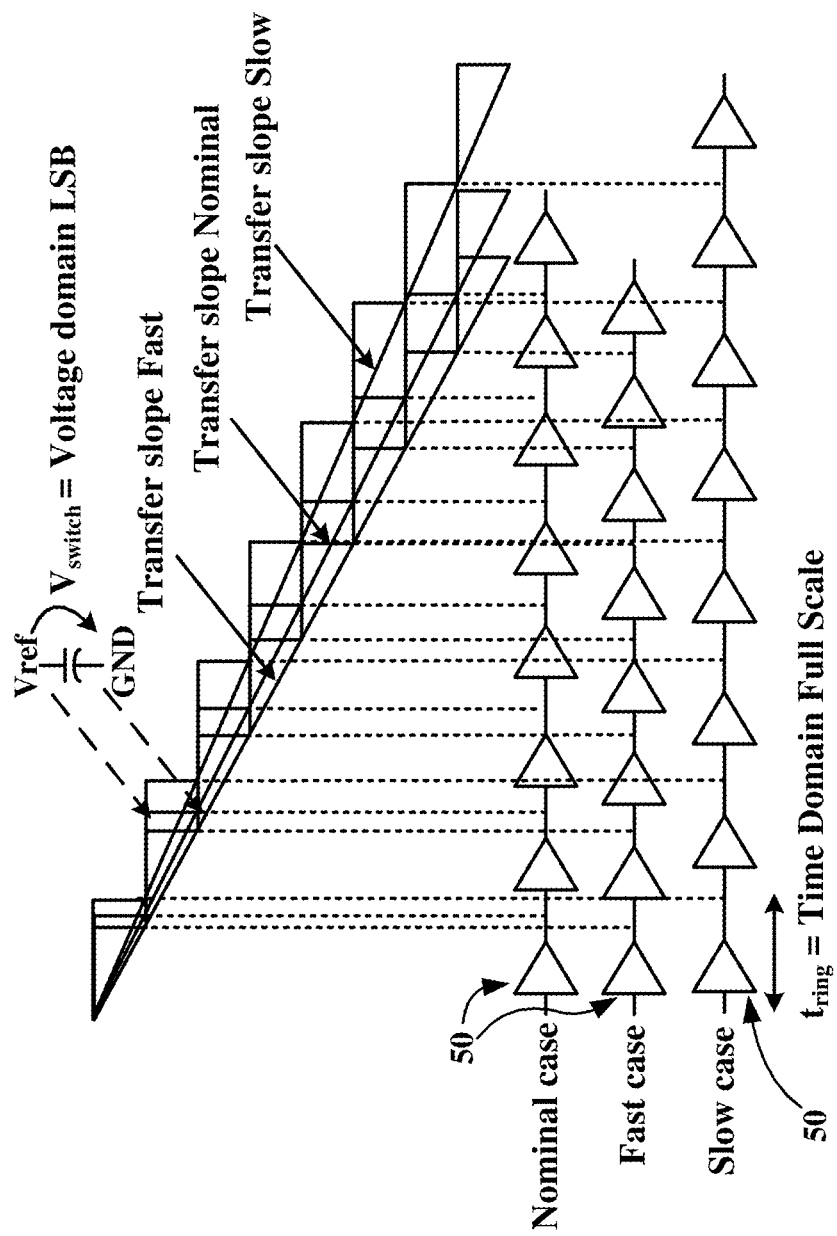

FIG. 7 is a graphical and diagrammatic view of an internal PVT tracking technique implemented by, and embedded in, the ring-TDC based time quantizer in accordance with one example, in which the slope of the switching-capacitor based VTC is determined by the total delay in one lap of the ring TDC and the voltage applied to the switching capacitor. This configuration automatically guarantees that the full scale of the time domain quantizer is aligned with the LSB of the voltage domain regardless of the variation of the PVT.

Figure 8:
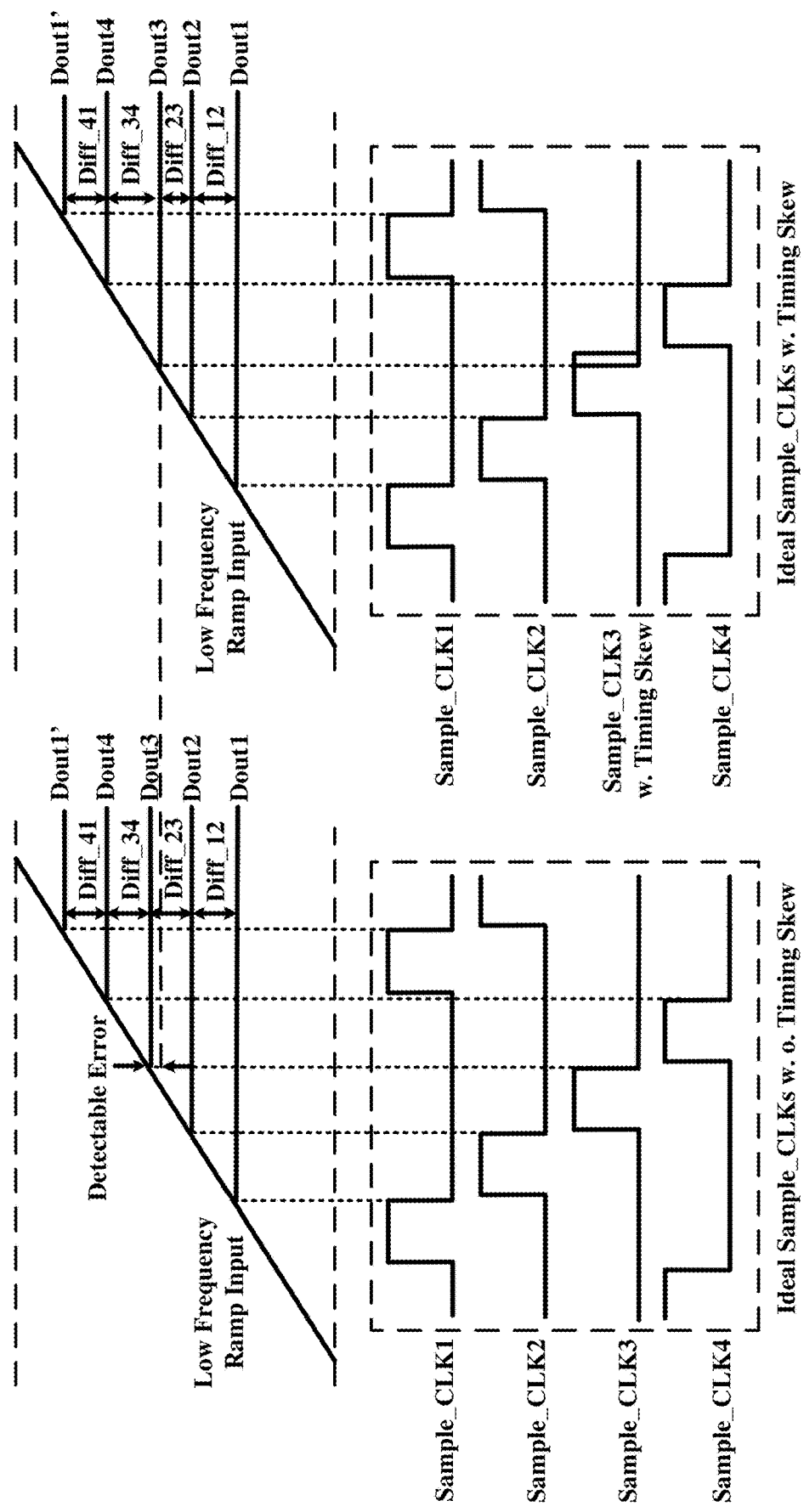

FIG. 8 depicts a graphical view of a timing skew calibration technique in accordance with one example, in which, in a foreground calibration mode, a low frequency ramp signal is used as the ADC input signal. The left of the figure shows an ideal case where no timing skew occurs. Since the slope of the ramp signal remains constant when the input is sampled by interleaved ADC cores, the time intervals between two adjacent sample points remain constant. As a result, the differences between two adjacent digital outputs, illustrated as Diff_12, Diff_23, Diff_34, and Diff_41 in the figure, remain the same. The right of the figure illustrates a case where timing skew occurs in the 3rd sample clock (Sample_CLK3). Since the sample edge of Sample_CLK3 is earlier than that in the ideal case, the sampled voltage of the 3rd ADC core is smaller than that in the ideal case. Hence, Dout3 becomes smaller. The change of Dout3 can be detected by detecting smaller Diff_23 and larger Diff_34.

Figure 9:
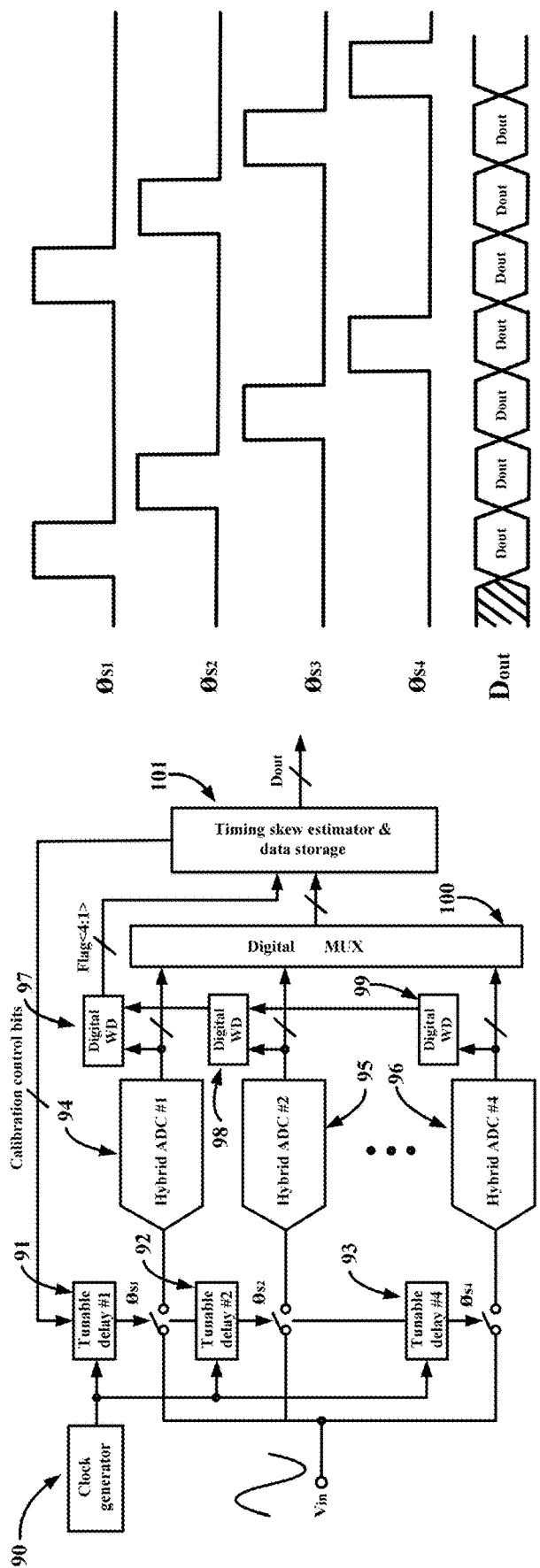

FIG. 9 depicts a block diagram of a timing skew calibration architecture in accordance with one example, along with a timing diagram of signals processed or provided thereby.

Figure 10:
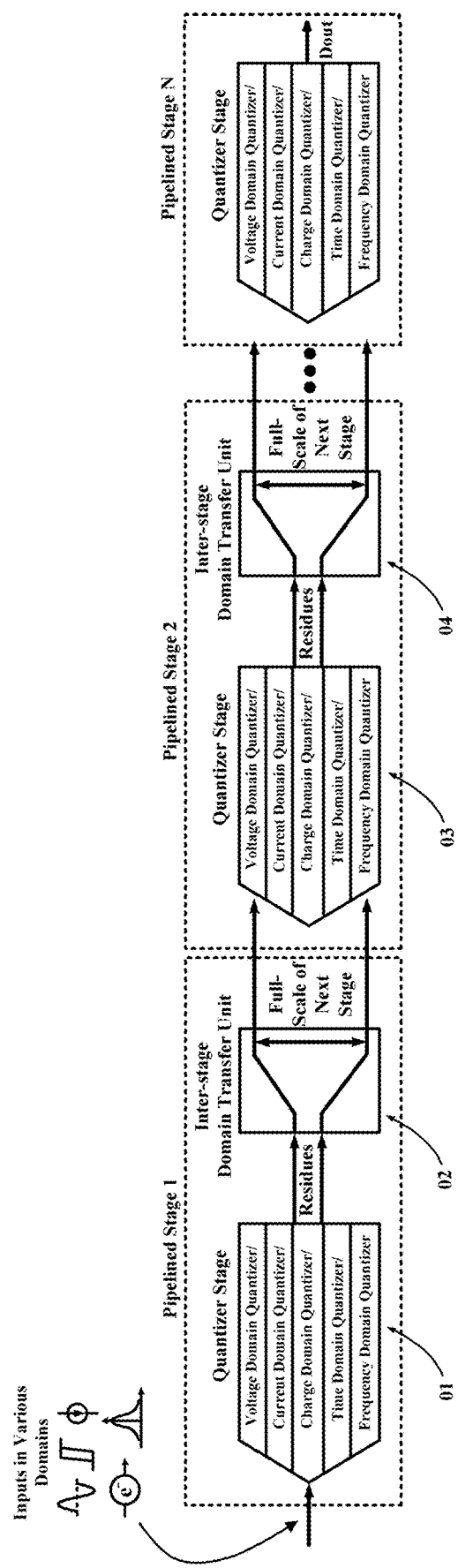

FIG. 10 is a block diagram of an architecture of a hybrid analog-to-digital converter with voltage, current, time, frequency, and/or charge domain signal processing in accordance with one example.

The embodiments of the disclosed converters may assume various forms. Specific embodiments are illustrated in the drawing and hereafter described with the understanding that the disclosure is intended to be illustrative. The disclosure is not intended to limit the invention to the specific embodiments described and illustrated herein.

DETAILED DESCRIPTION OF THE DISCLOSURE

An analog-to-digital converter includes a hybrid pipelined topology with multi-domain signal processing, including, but not limited to, voltage, current, time, frequency and charge domain signal processing and quantization. The architectures described herein include a first converter stage, a second converter stage coupled to the first converter stage to quantize a residue signal of the first converter stage, and an inter-stage converter disposed between the first and second converter stages. The inter-stage converter is configured to convert between a first domain and a second domain. The inter-stage converter is configured to process the residue signal of the first converter stage such that a range of the residue signal matches a full scale of the second converter stage. As examples of the multi-domain dataconverters, also described are hybrid two-stage ADCs with voltage-domain SAR ADCs as a coarse quantizer and time-domain time-to-digital converters (TDCs) as a fine quantizer. The fine quantizer may either be or otherwise include a ring TDC or a Vernier ring TDC with its full-scale range automatically matched with the residue of the coarse quantizer. The discharge based inter-stage voltage-to-time converters (VTCs) allow simultaneous operation of the VTC and the TDC, achieving a higher sample rate with low power consumption.

Hybrid analog-to-digital converters with time domain quantizers (e.g., fine quantizers) are described. The hybrid converters may be used in a wide variety of systems, including communication systems, such as radio receivers. The architectures of the disclosed converters are suitable for high speed operation with high resolution and low power consumption.

The disclosed hybrid ADC architectures may include a time domain quantizer that provides fine quantization with improved power efficiency and stable performance against PVT variations. For example, when pipelined with a multi-bit per cycle SAR ADC as the coarse quantizer, the disclosed hybrid ADC (e.g., in examples without time-interleaving) achieves greater than 500 MHz sample rates and 10-bit to 14-bit resolution when implemented in 40 nm to 22 nm technologies, which enables applications for low-power broadband wireless networks.

In one example architecture, a high sample-rate is achieved with time domain fine quantization and background PVT calibration. In another example architecture, better power efficiency and robust operation is achieved with an embedded PVT inner-tracking technique to eliminate the need for background calibration. Both example architectures utilize a hybrid ADC architecture with time domain quantization techniques that include multiple aspects directed to achieving a power efficiency Figure-of-Merit (FoM) not attained heretofore.

In some cases, the disclosed hybrid ADCs include an ADC stage as a coarse quantizer, a VTC to convert the voltage residues of the coarse ADC stage to the time domain, a TDC stage as a fine quantizer, and a calibration unit that tracks PVT variation and automatically adjusts VTC gain so that the residues from the voltage domain are aligned with, or otherwise match, the full scale of the time domain quantizer over (e.g., regardless of) PVT variations.

The conversion speed of the disclosed hybrid ADCs may be improved by time-interleaving techniques. The time-interleaved ADCs include multiple identical single core ADCs that perform data conversion in parallel. The conversion speed of N time-interleaved ADCs may be N times larger than the sample rate of the single core ADC. However, without calibration of the non-overlapped clocks used to clock the interleaved ADCs, timing skews and mismatches among these clocks would cause ADC performance degradation. In the disclosed converters, a calibration technique that features simple implementation and fast convergence is provided that automatically calibrates the timing skews and mismatches to secure ADC performance. The disclosed calibration technique may be applied to the examples described below when employing time-interleaving techniques.

In one example, a converter includes a 2-bit per cycle SAR ADC stage as a coarse quantizer, a discharging-based VTC inter-stage for voltage-to-time conversion, a 2-dimensional Vernier TDC stage as a fine quantizer and a phase-detector-based background calibration loop for VTC gain calibration against PVT variations. The number of bits, topologies, and/or other characteristics of the ADC stage, the VTC inter-stage, and the TDC stage are only illustrative and do not limit the application of the architecture to other combinations of topologies. The 2-bit per cycle SAR ADC and 2-dimensional Vernier TDC are used to improve the conversion speed. Other multi-bit per cycle SAR ADCs may also be used to achieve a desired level of performance with various power consumption and hardware. Moreover, the 2-bit per cycle SAR ADC generates a pair of voltage residues after the coarse quantization, including two input dependent voltages and two reference voltages related to the full-scale of the coarse ADC. As a result, one residue voltage may be used as the input signal of the VTC, while another residue may be used for TDC full-scale calibration to align or otherwise match the voltage-domain signal with its time-domain counterpart over PVT variations.

In another example, a converter includes a single bit per cycle SAR ADC stage as a coarse quantizer in the voltage domain and a ring-TDC stage as a fine quantizer in the time domain. The numbers of bits, topologies, and/or other characteristics of the ADC, VTC, and TDC are only illustrative and do not limit the application of the architecture to other combinations of topologies. The ring-TDC-based fine quantizer stage is configured to convert voltage residues to time domain signals and digitize them at the same time. Utilizing a capacitor-switching technique, the Least-Significant-Bit (LSB) is aligned to the TDC full scale such that no additional PVT calibration is needed. Furthermore, the ring TDC inter-stage is used to time the VTC conversion and starts operation immediately when the VTC conversion is done with no interface involved.

A comparison of these two example architectures indicates the following: the first example architecture has potential to operate at a higher sample rate because a SAR ADC stage with multiple bits per cycle is used as the coarse quantizer, while the second example architecture features better power efficiency with reduced design complexity.

The configuration, arrangement, and/or other characteristics of the coarse quantizer, the VTC inter-stage, and the fine quantizer are not limited to the topologies referenced above. For instance, a single bit or multi-bit per cycle SAR ADC and/or other ADC topologies, such as flash or flash with SAR ADCs, may be used as the coarse quantizer. A discharging based VTC or current starved VTC may be used as the VTC inter-stage. Moreover, a TDC with a single delay chain, Vernier delay chains, 2-D Vernier comparator arrays, and ring or Vernier ring TDCs may be used as the fine quantizer.

Figure 1:
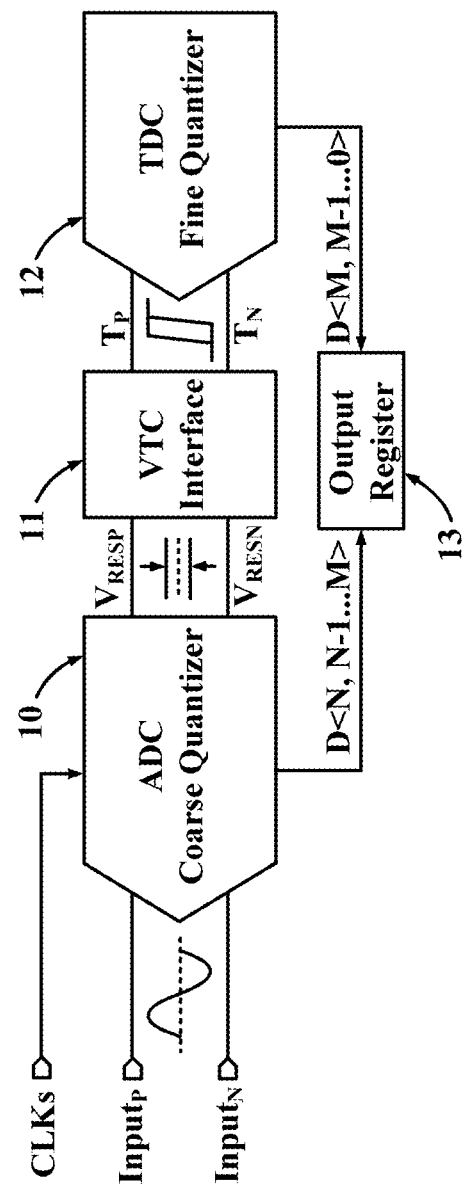
FIG. 1 is a schematic view of a hybrid ADC having a voltage domain ADC stage as a coarse quantizer, a VTC as an inter-stage, and a TDC stage as a time-domain fine quantizer, in accordance with one example.

With reference now to the drawings, FIG. 1 shows a hybrid converter having a first converter stage 10, an inter-stage converter 11, and a second converter stage 12. The second converter stage 12 is coupled to the first converter stage 10 (e.g., via the inter-stage converter 11) to quantize a residual voltage range of the first converter stage 10. The inter-stage converter 11 is disposed between the first and second converter stages 10 and 12.

The inter-stage converter 11 is configured to convert between a voltage domain and a time domain. In some cases, the first converter stage 10 operates in the voltage domain, converting from analog to digital. In such cases, the second converter stage 12 operates in the time domain, converting from time to digital. In other cases, the domains of the stages may differ in other cases.

In the example of FIG. 1, the first converter stage 10 includes an ADC as a coarse quantizer, such that the inter-stage converter 11 includes a VTC configured to convert the residue voltage to time intervals for quantization in the time domain. The second converter stage 12 accordingly includes a TDC as a fine quantizer.

Examples of the architecture of FIG. 1 are described below in greater detail. Multiple instances of the examples may be employed in time-interleaved ADCs in some cases, in which a timing-skew calibration technique is implemented to mitigate the effect of time-interleaving clock mismatches. The operational aspects of the disclosed architectures and the timing-skew calibration technique are also described below.

The hybrid converters described herein may have more than two converter or quantizer stages. Thus, in other cases, one or more intermediate converter stages may be disposed between the first converter stage 10 and the second converter stage 12. An example having a number N of pipelined stages is described and shown in connection with FIG. 10 below.

Figure 2:
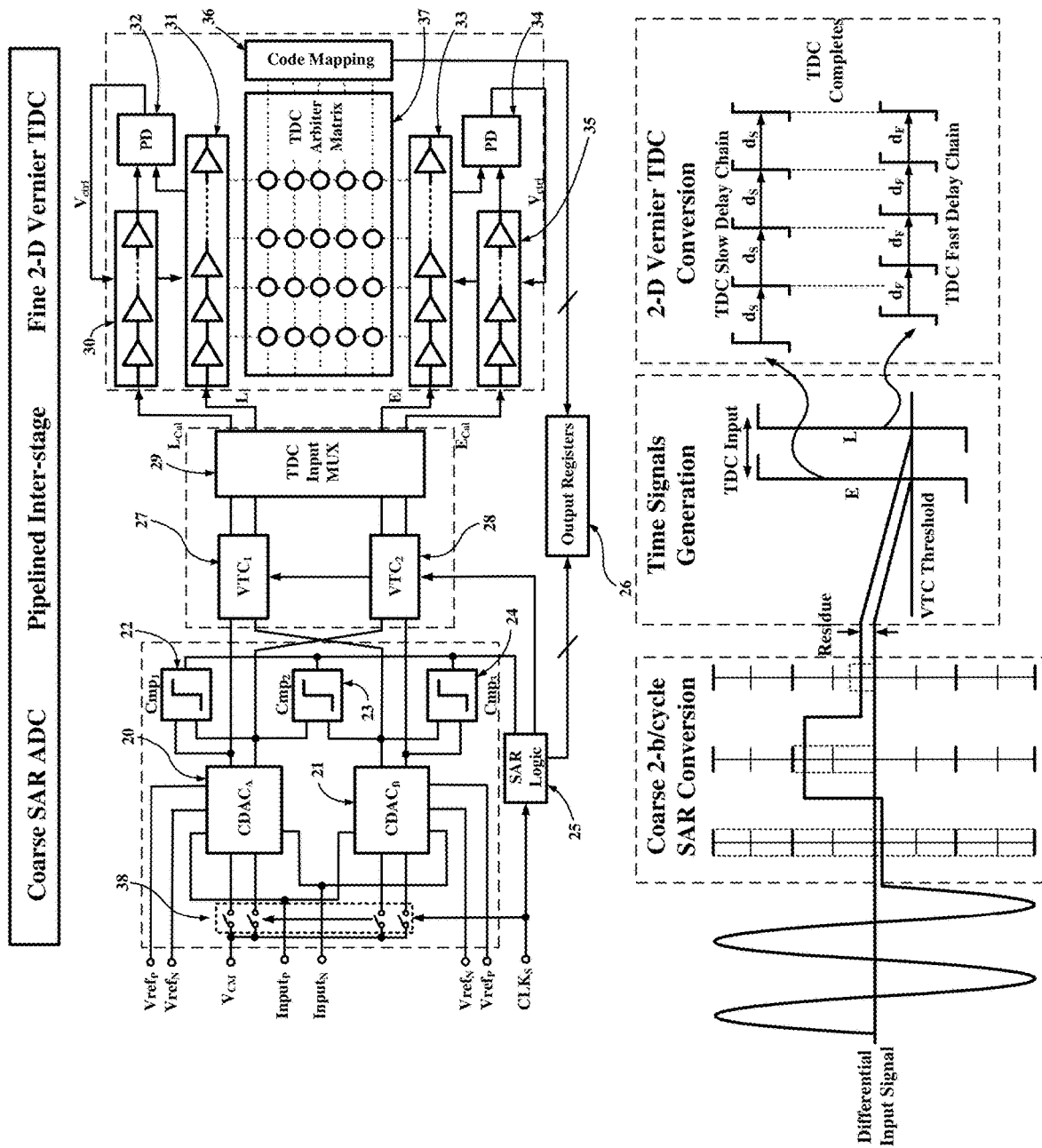
FIG. 2 depicts a schematic view of a hybrid ADC having a 2-bit per cycle SAR ADC stage as a coarse quantizer, a discharging-based VTC as an inter-stage, a two-dimension Vernier TDC stage as a fine quantizer, and a background PVT calibration loop, in accordance with one example, along with graphical and diagrammatic views of the operation of the hybrid ADC.

FIG. 2 illustrates an ADC having an architecture in accordance with one example. The ADC in this example includes a 2-bit per cycle SAR ADC stage, a discharging-based VTC (in this cases, units 27, 28), a 2-dimension Verner TDC, and a background PVT calibration loop. The topologies, configuration, and/or other characteristics of the SAR ADC, VTC and TDC elements may differ from the example shown.

In operation, clock signal $CLK_s$ turns on sample switches 38 and initiates SAR logic unit 25. In order to attain better sampling linearity at a high sample rate, bootstrapped switching and bottom-plate sampling may be employed in the architecture. When the sampling switches 38 are enabled, differential input signals, InputP and InputN, are sampled to a first capacitor-digital-to-analog converter (CDAC1) 20 and a second capacitor-digital-to-analog converter (CDAC2) 21. When the sampling switches 38 are disabled, the conversion phase begins and the zero-crossing signals are generated at the CDAC top plate by switching the capacitors. Comparators $Cmp_{1-3}$ 22, 23, 24 detect the zero-crossing signals, determine the subrange, and generate the finer zero-crossing signals. After a certain number of conversion cycles, the voltage residues have become smaller than the least significant bit (LSB) of the voltage-domain quantizer and are ready to be sent to the inter-stage VTC units 27, 28 for the next pipelined operation. Then, the SAR logic unit 25 enables each of $VTC_{1-2}$ 27, 28, while the CDACs 20 21 hold the voltage residues. After operation of the VTC units 27, 28 is completed and the time signals are generated for the TDC, the coarse SAR ADC is reset and ready for converting the next sampled data.

During the operation of the $VTC_{1-2}$ units 27, 28, identical current sources are applied to discharge the voltage residues that are held by the CDACs 20 21. Therefore, these voltage residues discharge at a certain speed and finally cross a pre-set threshold voltage. Crossing detectors are used to detect the moment that the threshold is crossed by the discharged residues and the rising edges are generated when the crossings occur. These rising edges are then sent to a TDC input MUX 29 to determine which edge arrives first. After the comparison, the leading edge is sent to a slow delay line 33, and the lagging edge is sent to a fast delay line

31. The other two edges that have a certain relationship to the leading and lagging edges as well as the full-scale information are sent to corresponding calibration delay lines 30, 35 for full-scale calibration against PVT variations.

The 2-D Vernier TDC, used as the fine time quantizer, includes the two delay lines 31, 33 with slightly different delays and a 2-D comparator array 37. The time interval between the leading and lagging edges is quantized by interpolating the position where the lagging edge propagating in the fast delay line 31 catches the leading edge propagating in the slow delay line 33. Once this "catching position" is detected by the comparator array 37, the TDC stops the quantization process in order to save power. The outputs of the TDC, which may be thermometer coded, are sent to code a mapping circuit 36, which converts the data to binary codes which are then combined with the binary codes obtained from the coarse SAR ADC.

The PVT background calibration loop includes two calibration delay lines 30, 35, two phase detectors 32, 34, and delay line bias control circuits. As mentioned before, there are four voltage signals generated from the 2-bit per cycle SAR ADC. Examples of the quantitative relationships of the signals are shown in FIG. 3. Two of them are chosen as the VTC inputs that further generate the TDC inputs because they contain the zero-crossing information. The other two signals may be used for calibration because their differences to the VTC inputs are a quarter of full-scale of the subrange. By configuring the total delay of the calibration delay lines as a quarter of the full-scale length, the calibration signals at the end of calibration lines 30, 35 may be precisely set as the delays that the TDC inputs propagate in the fast and slow delay lines 31 33, respectively. The phase detectors 32, 34 check their phase differences at the end of every conversion cycle and use the results as a closed-loop feedback to tune the bias currents of the delay lines 30, 35.

FIG. 4 depicts a hybrid ADC in accordance with another example. The hybrid ADC in this case includes a one-bit per cycle SAR ADC stage as the coarse quantizer, an inter-stage VTC with passive residue transfer, and a hybrid time domain quantizer stage using a ring TDC as the fine quantizer. The configuration and/or other characteristics of the SAR ADC, the inter-stage VTC and the TDC may vary from the example shown.

In the sampling phase, sample switches 43 are turned on by clock signal $CLK_s$. As mentioned before, bootstrapped switching and bottom-plate sampling may be used to attain better sampling linearity at high sample rate. The 1-bit per cycle SAR ADC employs a single comparator 41 and a single CDAC 40 to maximize the power efficiency and avoid mismatches in the first stage. The drawback is that the conversion speed of the first stage is low. However, in the subsequent stage, VTC operation and fine quantization are operating simultaneously in a pipelined manner. In addition, the interface between the VTC and the TDC is eliminated. These features increase the overall conversion speed and thus improve the figure-of-merit (FoM) of the entire hybrid ADC.

When SAR ADC conversion is done, SAR logic unit 42 initiates the passive inter-stage. In this case, the passive inter-stage includes transfer switches 44 and transfer capacitors 45. When transfer switches 44 are turned on, the voltage residues from the first stage are directly sampled to the top plates of the transfer capacitors CT 45. After the residue sampling is done, the first stage SAR ADC is ready for the next sampling phase.

The sampled residues are then shared with the capacitor arrays 46 in the second stage and level shifted by the switching capacitor. The passive inter-stage is utilized for three reasons. First, no power-hungry amplifier is needed and thus the noise requirement is much relaxed in the time domain quantizer. Second, the gain of the inter-stage transfer function is only determined by the capacitance ratio, which is insensitive to PVT variations. Third, the passive residue transfer stage achieves good power efficiency.

The second stage is or includes a ring-TDC-based hybrid time domain quantizer. In this example, the ring-TDC-based hybrid time domain quantizer includes a ring TDC 50, a TDC-controlled capacitor array 46, a continuous-time comparator (CT Cmp.) 49, and a sub logic circuit unit 47. After the residues from the first stage are sampled and level shifted, the sub logic unit 47 sends a start signal to a sub CDAC 46. When the start signal is received, the sub CDAC 46 switches a unit capacitor from Vref to ground, resulting in the top plate residue voltage switching down one LSB. Meanwhile, the start-signal propagates in the ring TDC 50. When the start signal returns to the starting point in the ring 50, the sub logic unit 47 generates another switching signal and the residue on the CDAC 46 is switched one LSB down again. The process results in a ramp-down signal for the voltage residue and the ramp-down slope is determined by the total delay of the ring TDC 50. On the other hand, the top plates of the sub-CDAC 46 are connected to a continuous-time comparator 49. Similar to the zero-crossing detector in the aforementioned discharging VTC, the continuous-time comparator 49 generates a rising edge once the ramp-down signal crosses another residue voltage obtained from the coarse quantizer. After that, the comparator output is sent to another line in the ring TDC 50. With the generated two time-domain edges, the TDC comparison is automatically initiated. The ring TDC 50 operates in a manner similar to that of a conventional TDC except that the signals propagate in a delay line configured in a ring, and the process repeats once the starting point is reached. The ring configuration permits a larger detectable range with less delay cells and thus minimizes the device mismatches due to the reduced size and more compact layout. When the crossing of two signals is detected by the comparators in the TDC, the time domain conversion is completed.

There are two types of time domain quantization in the second stage. The first type is implemented using the ring TDC 50, the sub-CDAC 46, and the continuous-time comparator 49. During the process, the CDAC switching signal propagates and circulates in the delay line of the ring TDC. Each time the switching signal propagates one lap in the ring TDC 50, the residue voltage stored on the sub-CDAC 46 is switched down with a step size of 1 LSB. Because the switching of the sub-CDAC 46 is timed by the delay of the ring TDC 50, the full scale of the time domain quantizer matches, e.g., is set to be equal to, the delay that occurs in one lap in the ring TDC 50. Therefore, the residue voltage stored on the CDAC 46 is gradually switched down to approach another residue voltage ($V_{TH}$ of the crossing detector). The crossing position is detected by continuous-time comparator 49. The residue quantization may be done by counting the number of unit capacitors that have been switched before the crossing event occurs. Moreover, the continuous-time comparator is configured with lower bandwidth compared to the switching step frequency. The crossing point detected is actually very close to the crossing point that occurs when discharging with a current source, as shown in FIG. 5. Therefore, the output of the continuous-time comparator 49 may be treated as the output of a discharging VTC. Therefore, the residues of the CDAC switching are linearly transferred to the time-domain signals. As depicted in FIG. 5, the residues prior to the crossing event are equal to the voltage difference between the fixed residue voltage ($V_{TH}$ of the crossing detector) and the voltage stored on the CDAC that are switched down every cycle. The continuous comparator is configured with good linearity, as a result of the reduced bandwidth. As a result, the voltage residue may be linearly transferred to time domain as shown in FIG. 5. The switching signal, the first of the two rising edges prior to the crossing event (see the two rising edges encircled with the label "Time residue" in FIG. 5), represents the voltage residue before the last switching, while the crossing detector output (the second of the two rising edges in the circle) denotes the crossing point ($V_{TH}$ of the crossing detector).

The second type of time domain quantization is implemented using the ring TDC 50. When the output of the continuous comparator 49 is fed to another line in the ring TDC 50, it creates a new pair of time domain signals as well as the switching signal before the crossing occurs. Since the switching signal has been propagating in the ring TDC 50, the comparison automatically begins when output of the continuous-time comparator 49 is received by the ring TDC 50. The conversion resolution of the ring TDC 50 is determined by the delay of the unit delay cell. In summary, the time domain quantizer is able to automatically switch from coarse conversion mode to fine conversion mode, while converting voltage residues to time domain signals.

FIG. 6 depicts two examples of the time domain quantizer in greater detail. In one example, a single ring quantizer 52 includes one delay line with the resolution determined by the unit delay t and the full range of the time quantization is aligned with the residual range in the voltage domain. Due to the reuse of the hardware in the ring configuration, the full range of the ring TDC may be as large as needed, and is limited only by the size of the memory that stores the outputs and the corresponding conversion time. If the signal propagates in the ring for M laps and k unit delay cells before the crossing event occurs, the detected time is equal to (MN+k)τ, where N is the number of unit delay cells in one lap in the ring.

In the other example, a Vernier ring quantizer 53 includes two slightly different delay lines. The resolution is determined by the difference between their unit delay cells, namely, $\tau_s - \tau_f$, where $\tau_s$ and $\tau_f$ denote the unit delays in the slow line and fast line, respectively. Again, the full range of the Vernier TDC is not limited and may be aligned with the residual range in the voltage domain. If the signal propagates in the Vernier ring for M laps and k unit delay cells before the signal in the fast line catches the signal in the slow line, the detected time is equal to (MN+k)($\tau_s - \tau_f$). When compared with the single ring quantizer 52, the Vernier ring quantizer 53 has improved resolution ($\tau_s - \tau_f$) that cancels the first-order mismatches under PVT variations because all the delay cells are built using identical topologies. The drawback of the Vernier quantizer is the prolonged conversion time with the reduced time steps. When compared with prior art VTC and TDC schemes, the two examples shown in FIG. 6 have several distinct advantages, including, for instance, fine resolution, a large conversion range, less hardware and the elimination of a highly linear inter-stage VTC, etc. In addition, the single ring quantizer 52 features a fast conversion rate, while the Vernier quantizer 53 provides fine resolution.

The configuration of the Vernier ring TDC of the disclosed converters may vary from the examples shown and described herein. Further details regarding Vernier ring TDCs for use in the disclosed converters are provided in U.S. Pat. No. 8,138,958 ("Vernier Ring Time-to-Digital Converters with Comparator Matrix"), the entire disclosure of which is hereby incorporated by reference. Other types of ring-based converters may be used, including, for instance, the converters described in U.S. Patent Publication No. 2008/0069292 ("Gated Ring Oscillator for a Time-to-Digital Converter with Shaped Quantization Noise"), the entire disclosure of which is hereby incorporated by reference.

FIG. 7 illustrates a PVT inner tracking and compensation technique in accordance with one example. A useful aspect of the technique involves the simultaneous operation of the VTC and TDC. When the VTC is converting the residual voltage to the corresponding time intervals, the TDC may start the conversion simultaneously without waiting for the completion of the voltage-to-time conversion. The VTC transfer function is determined by the slope of the ramping down signal generated by the switching capacitors. As explained earlier, the slope is determined by the full-scale of the voltage residual, the number of fine quantization steps, and the lap length of the ring TDC 50. In other words, the slope is dependent on the step size of the switching capacitor that is set exactly to the length of the LSB in the voltage domain. Consequently, the time domain resolution is always aligned to that of voltage domain without complicated calibration loops. This innovative scheme automatically guarantees the performances of the proposed ADC under PVT variations, which have been a dilemma in all prior-art ADC designs.

The aforementioned ADCs may be time-interleaved to achieve higher sample rate. Interleaving a number N of identical ADC cores may increase the conversion rate by N times. The clock at the desired sample frequency is first divided by N times to create N non-overlapping sample clocks with uniform phase delay. As a result, ADC cores sample the input in a sequence controlled by the multi-phase clocks. Each core still operates at 1/N overall sample rate. Their digital outputs are resampled through a multiplexer at higher frequency to reconstruct the final outputs. The main challenge of the time-interleaving technique lies upon the clock skews among the N sub-sample clocks. Any mismatches among the multi-phase clocks may greatly degrade the ADC performance. The higher the ADC resolution is, the less tolerance on the clock, the skew will have.

To mitigate the clock skew or mismatch problem in the time-interleaving ADCs, a calibration technique with fast convergence may be used. Because the timing skew error is generally larger than the effect of ADC quantization error and other noise, the timing skew may be detected by analyzing the ADC output response to a ramp input.

FIG. 8 depicts an example of the calibration technique. The ideal system without timing skew is shown on the left side. Because the time interval between each two adjacent sample points are the same, the difference between adjacent sampled voltages, labeled as Diff_12, Diff_23, Diff_34, and Diff_41 is identical. On the right side of FIG. 8, in presence of the timing skew, the sample edge of Sample_CLK3 is earlier than that in the ideal case, as an example to illustrate the operation of the technique. As a result, Diff_23 decreases and Diff_34 increases from their ideal values. To measure the change of Diff_23 and Diff_34, a reference that is not affected by timing skew is introduced. The reference may be set as the average value of Diff_12, Diff_23, Diff_34, and Dif_41 because the time interval between one sample edge of Sample_CLK1 and the next sample edge of Sample_CLK1 is not affected by the timing skew. The reference may also be set manually if the slope of the input ramp signal is given. Comparing Diff_12, Diff_23, Diff_34, and Diff_41 with the reference, the timing skew may be determined, and a bang-bang calibration may be performed by simply increasing or decreasing the time interval between the two clock edges, which may be done by tuning respective delay lines inserted on the multi-phase clock paths.

In order to minimize the measurement errors, a large number of samples may be collected to calculate the averaged values of Diff_12, Diff_23, Diff_34, and Diff_41. Unlike random noise, timing skew errors are often time-invariant, and thus the direction for tuning the phase delays remains invariant over a period of time.

FIG. 9 depicts a timing-skew calibration implementation in connection with an example of time-interleaved ADCs. In this case, an interleaved by 4 architecture is shown as an example. In the time-interleaved architecture, four single-core ADCs sample the input sequentially. The digital output of each single-core ADC is first processed by the embedded window detector to determine if the output is suitable for timing-skew estimation. A flag signal is generated if the output is suitable for estimation and the timing-skew calibration logic is enabled. After timing-skew estimation, the calibration control signals are sent to corresponding tunable delay cells to adjust the sample edge of the interleaved ADCs. The calibration procedure repeats until the timing-skew error is compensated.

In the example of time-interleaved ADCs with embedded timing-skew calibration depicted in FIG. 9, a clock generator 90 receives a full-speed sample clock and generates sample clocks for each single-core ADC in sequence. After conversion by ADCs 94, 95, 96, the digital outputs of the ADCs are processed by window detectors 97, 98, 99 to determine if the output is suitable for timing-skew estimation. A digital multiplexer 100 receives digital outputs from individual single-core ADCs and generates an overall digital output. Finally, a timing-skew estimator 101 collects the timing-skew information from the digital output and sends control signals to tunable delay cells 91, 92, 93 to compensate for the timing skews.

FIG. 10 depicts a hybrid analog-to-digital converter architecture with a number N of pipelined stages in accordance with one example. Each stage in the pipeline may be configured to implement signal processing in a respective domain, including, without limitation, the voltage, current, charge, time, and frequency domains. For instance, any one of the stages may be configured as a voltage domain quantizer or a time domain quantizer as described herein. The architecture of FIG. 10 depicts various options for the domain of each quantizer stage.

In operation, an analog input signal in a respective domain is provided to a quantizer stage of the first pipelined stage. A digital representation of the analog input signal is provided as an output signal by the last stage, e.g., pipelined stage N. Any number of intermediate stages (e.g., zero or more) may be included in between.

Each pipelined stage includes a quantizer stage and an inter-stage domain transfer unit (or other inter-domain converter) to which a residue from the quantizer stage is provided. Each quantizer stage implements quantization in one of the domains, e.g., voltage, current, charge, time and frequency. The inter-stage between two successive stages transfers the residue from the previous stage to a signal type of the next stage. As described herein, the range of the residue is processed to match the full scale of the next stage.

In this example, with an input signal in one of the various domains, quantizers 01, 03 in each pipelined stage may be configured in accordance with the input signal type and desired performance characteristics (e.g., as described herein). Inter-stage domain transfer units 02, 04 are used between two successive pipelined stages to transfer the residue from the previous stage to a full-scale signal of the type in accordance with the domain of the next stage.

The various analog-to-digital converters with time domain fine quantizers described herein may be considered as examples of the hybrid data converter architecture depicted in FIG. 10. By selecting the proper signal types with the best power efficiency figure-of-merit (FoM) for each quantization stage, the disclosed hybrid converter architecture is capable of achieving the best overall FoM for high speed, high resolution and low power data-converter applications.

Described above are hybrid converters that combine ADC and TDC stages for high performance operation either with or without time-interleaved architectures. The hybrid converters include a coarse quantizer, a fine quantizer, and inter-stage circuitry. The hybrid converters may have any one, or a combination, of the following features. In one hybrid pipelined ADC architecture, a high conversion rate is achieved by using a pipelined architecture, with inter-stage requirements relaxed due to the reduced full scale of residue by the voltage domain coarse quantizer, and high resolution due to the use of a time domain fine quantizer. Such hybrid ADC architectures may use one or more voltage domain converters (ADCs) as the coarse quantizer (first stage), one or more voltage-to-time converters (VTCs) as the inter-stage, and one or more time domain convertors (TDCs) as the fine quantizer (second stage). Alternatively, a hybrid converter includes time domain convertors as the coarse quantizer (first stage) and voltage domain convertors as the fine quantizer (second stage). This approach may be useful for applications with direct time domain inputs. In other cases, the hybrid converter includes multiple voltage domain convertors and time domain convertors in other sequences of implementation.

With one or more voltage domain convertors as the coarse quantizer and one or more time domain convertors as the fine quantizer, a wide variety of types of ADCs or ADC architectures may be used for the coarse quantizer, including, for instance, a 1-bit per cycle SAR ADC, a 2-bit per cycle SAR ADC, a multi-bit per cycle SAR ADC, a sigma-delta SAR ADC, a flash ADC, a flash ADC followed by a SAR ADC, a flash ADC followed by a multi-bit per cycle SAR ADC, a pipelined ADC cascading ADCs of the aforementioned or other types, a hybrid ADC operating in voltage domain and including any of the aforementioned or other ADCs, or in any combination thereof.

A wide variety of types of VTCs or VTC architectures may be used, including, for instance, a discharging based VTC, a current starved VTC, a switching capacitor based VTC that employs a CDAC and a crossing detector to convert the voltage residue to an interval in time domain, a dynamic amplifier based VTC, and a hybrid VTC that converts voltage domain signals to time domain signals, and includes any of the aforementioned or other VTCs, or in any combination thereof.

A wide variety of types of TDCs or TDC architectures may be used for the fine quantizer, including, for instance, a flash TDC with a single delay line, a Vernier TDC with two delay lines, a Vernier TDC with a 2-D comparator array, a single ring TDC with a single delay line configured in a ring, a Vernier ring TDC with two delay lines configured in a couple of rings, a hybrid TDC operating in the time domain and including any of the aforementioned or other TDCs, or in any combination thereof.

Any one of the disclosed converters may be configured to implement a timing-skew calibration technique for time-interleaved ADCs that detects the timing-skew by calculating the differences between digital outputs of each two adjacent ADC single cores, sampling the same ramp signal, and comparing them with a timing-skew-free reference value. The calibration technique may be implemented by circuitry including, for instance, a built-in ramp signal generator that generates a reference input signal for the foreground calibration process (e.g., the slope of the ramp signal may be programmed in accordance with the calibration), pre-set ADC core identification bits that identify the source of each digital output, which may be useful when locating the timing skew error manually, one or more digital processing circuits configured to calculate the differences between each two adjacent digital outputs, store the calculated information, average acquired information, and detect timing-skew error, a timing-skew-free reference indicator (e.g., the reference may be set as the average value of all acquired differences or be input manually when the slope of the input ramp signal is known), and tunable delay cells configured to control the sample point of each ADC single core. These delay cells may either be automatically tuned via closed-loop calibration circuits or be tuned manually when the off-chip calibration process is conducted.

In some cases, a hybrid pipelined converter includes ADC and TDC architectures to achieve a high conversion rate, a discharging-based VTC for good inter-stage linearity, and PVT background calibration utilizing dual-residue detection to determine the full scale of the TDC. In such cases, voltage domain convertors may be used as the coarse quantizer (first stage), and time domain convertors may be used as the fine quantizer (second stage), including, for instance, a multi-bit per cycle SAR ADC as the coarse quantizer, discharging-based VTCs as the inter-stage voltage-to-time converters, and a 2-dimensional Vernier TDC as the fine quantizer. Alternative or additional quantizer and converter types and architectures may be used in other cases.

The hybrid pipelined converter may include a PVT background calibration circuit that utilizes the dual-residues available from, e.g., the multi-bit per cycle SAR ADC. The PVT background calibration circuit may be configured to implement a technique that includes or utilizes, for instance, generation, by the coarse SAR ADC, of two or more voltage residues that contain information of inputs and the subrange full scale, transfer of the generated voltage residues to time domain intervals, detection, e.g., close-loop calibration circuits, of the full-scale information generated by the coarse SAR ADC, and tuning, either with analog or digital tuning techniques, of the TDC resolution in accordance with the detected full-scale information.

In some cases, a hybrid pipelined converter includes a single channel SAR ADC and a ring TDC with embedded voltage-to-time functionality to provide superior power-to-speed efficiency. High resolution may be provided due to the wide detection range of the ring TDC. In such cases, PVT inner-tracking may also be provided because the switching capacitor VTC is driven by the ring TDC. Voltage domain converters may be used as the coarse quantizer (first stage), and time domain converters may be used as the fine quantizer (second stage), including, for instance, an ADC in voltage domain as the coarse quantizer, a switching capacitor based VTC that employs a CDAC and a crossing detector to convert the voltage residues to the time intervals, a ring TDC as the fine quantizer, a PVT inner-tracking scheme that utilizes both the switching capacitor VTC and the ring TDC.

The TDC may be or include, for instance, a single ring TDC with a single delay line configured in a ring, a Vernier ring TDC with two delay lines configured in a couple of rings, a hybrid TDC operating in time domain and including any of the aforementioned or other TDCs, or in any combination thereof.

The PVT tracking technique may utilize or otherwise include, for instance, a CDAC and a crossing detector to generate time intervals and digitize the time intervals simultaneously, a ring TDC configured to control the CDAC switching so that the switching step is correlated with the full scale of the residue signal, and feeding an output of the crossing detector to the ring TDC so that the time domain conversion may be started without additional amplification interface.

The present disclosure has been described with reference to specific examples that are intended to be illustrative only and not to be limiting of the disclosure. Changes, additions and/or deletions may be made to the examples without departing from the spirit and scope of the disclosure.

The foregoing description is given for clearness of understanding only, and no unnecessary limitations should be understood therefrom.

What is claimed is:

1. An analog-to-digital converter comprising:
   a first converter stage;
   a second converter stage coupled to the first converter stage to quantize a residue signal of the first converter stage; and
   an inter-stage converter disposed between the first and second converter stages, the inter-stage converter being configured to convert between a first domain and a second domain;
   wherein the inter-stage converter is configured to process the residue signal of the first converter stage such that a range of the residue signal matches a full scale of the second converter stage, and
   wherein:
      the first converter stage comprises a continuous switching capacitor DAC (CDAC) and a voltage comparator;
      the inter-stage converter comprises a voltage-to-time converter (VTC), the VTC having an input coupled to the voltage comparator;
      the second converter stage comprises a ring time-to-digital converter (TDC); and
      switching of the CDAC is timed by the ring TDC so that the range of the residue signal of the first converter stage is equal to the full scale of the TDC.

2. The analog-to-digital converter of claim 1, wherein the residue signal of the first converter stage corresponds with a least significant bit in the first domain.

3. The analog-to-digital converter of claim 1, wherein the TDC and the VTC operate simultaneously.

4. The analog-to-digital converter of claim 1, wherein the inter-stage converter comprises a CDAC discharging-based voltage-to-time converter (VTC) with CDAC switching timed by a lap delay of the ring TDC.

5. The analog-to-digital converter of claim 1, wherein:
   the first domain is a voltage domain;
   the second domain is a time domain;
   the inter-stage converter is configured to convert from the voltage domain to the time domain; and
   the residue signal has a residual voltage range equal to the full scale of the second converter stage.

6. A system comprising a set of analog-to-digital converters, each analog-to-digital converter being configured in accordance with claim 1, wherein:
the set of analog-to-digital converters are disposed in a parallel, time-interleaved arrangement; and
the system further comprises a timing skew calibration circuit configured to determine timing skew via a comparison of a difference between sampling edges with an average value of sampling edge differences.

7. An analog-to-digital converter of claim 1, further comprising:
a first converter stage;
a second converter stage coupled to the first converter stage to quantize a residue signal of the first converter stage;
an inter-stage converter disposed between the first and second converter stages, the inter-stage converter being configured to convert between a first domain and a second domain; and
a background calibration loop to align the range of the residue signal of the first converter stage with the full scale of the second converter stage;
wherein the inter-stage converter is configured to process the residue signal of the first converter stage such that a range of the residue signal matches a full scale of the second converter stage.

8. An analog-to-digital converter comprising:
a first converter stage configured for voltage domain quantization;
a second converter stage configured for time-to-digital quantization, the second converter stage being coupled to the first converter stage to quantize a residual voltage of the voltage domain quantization; and
an inter-stage converter disposed between the first and second converter stages, the inter-stage converter being configured to convert from a voltage domain to a time domain;
wherein the inter-stage converter is configured to process the residual voltage of the voltage domain quantization such that a range of the residual voltage matches a full scale of the time-to-digital quantization, and
wherein:
the first converter stage comprises a continuous switching capacitor DAC (CDAC) and a voltage comparator;
the inter-stage converter comprises a voltage-to-time converter (VTC), the VTC having an input coupled to the voltage comparator;
the second converter stage comprises a Vernier-ring time-to-digital converter (TDC); and
switching of the CDAC is timed by the Vernier-ring TDC so that the range of the residue signal of the first converter stage is equal to the full scale of the TDC.

9. The analog-to-digital converter of claim 8, wherein the TDC and the VTC operate simultaneously.

10. The analog-to-digital converter of claim 8, further comprising a background calibration loop to align the range of the residual voltage of the voltage domain quantization with the full scale of the time-to-digital (TDC) quantization.

11. The analog-to-digital converter of claim 8, wherein the inter-stage converter comprises a CDAC discharging-based voltage-to-time converter (VTC) with CDAC switching timed by a lap delay of the Vernier-ring TDC.

12. An analog-to-digital converter comprising:
a first converter stage configured for voltage domain quantization;
a second converter stage comprising a Vernier-ring, time-to-digital converter (TDC) for time-to-digital quantization, the second converter stage being coupled to the first converter stage to quantize a residual voltage of the voltage domain quantization; and
an inter-stage converter disposed between the first and second converter stages, the inter-stage converter being configured to convert the residual voltage from a voltage domain to a time domain;
wherein the inter-stage converter is configured to process the residual voltage such that a range of the residual voltage of the voltage domain quantization matches a full scale of the time-to-digital quantization, and
wherein a background calibration loop to align the range of the residue signal of the first converter stage with the full scale of the second converter stage.

13. The analog-to-digital converter of claim 12, wherein the first converter stage comprises a continuous switching capacitor DAC (CDAC) and a voltage comparator.

14. The analog-to-digital converter of claim 12, wherein:
the inter-stage converter comprises a voltage-to-time converter (VTC); and
the Vernier-ring TDC and the VTC operate simultaneously.

15. An analog-to-digital converter comprising:
a first converter stage configured for voltage domain quantization;
a second converter stage comprising a Vernier-ring, time-to-digital converter (TDC), the second converter stage being coupled to the first converter stage to quantize a residual voltage of the voltage domain quantization;
an inter-stage converter disposed between the first and second converter stages, the inter-stage converter being configured to convert the residual voltage from a voltage domain to a time domain; and
a background calibration loop to align the range of the residue signal of the first converter stage with the full scale of the second converter stage.

16. The analog-to-digital converter of claim 15, wherein:
the first converter stage comprises a continuous switching capacitor DAC (CDAC) and a voltage comparator;
the inter-stage converter comprises a voltage-to-time converter (VTC); and
the Vernier-ring TDC and the VTC operate simultaneously.

* * * * *

UNITED STATES PATENT AND TRADEMARK OFFICE
CERTIFICATE OF CORRECTION

PATENT NO. : 11,239,853 B1
APPLICATION NO. : 17/082481
DATED : February 1, 2022
INVENTOR(S) : Fa Dai, Haoyi Zhao and John David Irwin It is certified that error appears in the above-identified patent and that said Letters Patent is hereby corrected as shown below:

In the Claims

Column 17, Claim 7, Line 10:
Please remove "of claim 1, further"

Signed and Sealed this
Twenty-first Day of November, 2023

Katherine Kelly Vidal
*Director of the United States Patent and Trademark Office*